(12) United States Patent
McCollum

(10) Patent No.: US 6,324,102 B1
(45) Date of Patent: Nov. 27, 2001

(54) RADIATION TOLERANT FLASH FPGA

(75) Inventor: John McCollum, Saratoga, CA (US)

(73) Assignee: Actel Corporation, Sunnyvale, CA (US)

( * ) Notice: Subject to any disclaimer, the term of this patent is extended or adjusted under 35 U.S.C. 154(b) by 0 days.

(21) Appl. No.: 09/737,643

(22) Filed: Dec. 14, 2000

(51) Int. Cl.[7] .................................................. G11C 13/00
(52) U.S. Cl. .................. 365/185.33; 365/185.29
(58) Field of Search ........................ 365/185.33, 185.29, 365/218

(56) References Cited

U.S. PATENT DOCUMENTS 5,940,323 * 8/1999 Kwon .............................. 365/185.22

* cited by examiner

Primary Examiner—Terrell W. Fears

(74) Attorney, Agent, or Firm—Sierra Patent Group Ltd.

(57) ABSTRACT

A radiation tolerant flash memory cell switch includes a programming transistor switch coupled between two circuit nodes to be selectively connected to one another. A floating gate flash memory switch control circuit has a switch-control node coupled to the gate of the programming transistor switch. A sense transistor has a source coupled to the switch-control node, a gate coupled to a word line and a source coupled to a bit line. An addressing circuit is coupled to the word line and the bit line to periodically address the sense transistor. First and second sense amplifiers are coupled to the bit line. The first sense amplifier has a current trip point higher than current trip point of the second sense amplifier. Charge-leakage sensing logic is coupled to the first and second sense amplifiers and configured to generate a charge-leakage threshold signal when the sense transistor is addressed and the second sense amplifier has tripped but the first sense amplifier has not tripped. FPGA programming circuitry is coupled to the floating gate flash memory switch control circuit to reprogram the FPGA in response to the charge-leakage threshold signal.

4 Claims, 3 Drawing Sheets

RADIATION TOLERANT FLASH FPGA

BACKGROUND OF THE INVENTION

1. Field of the Invention

The present invention relates to field programmable gate array (FPGA) devices. More particularly, the present invention relates to FPGA integrated circuits employing flash memory as the programming medium and to providing radiation resistant flash FPGA integrated circuits.

2. The Prior Art

FPGA integrated circuits are well known in the art. The programming mechanisms for FPGA devices include antifuses, static random access memory (SRAM) devices and flash memory. Flash memory based FPGA integrated circuits usually comprise one or more floating gate flash MOS transistors. The one or more floating gate flash MOS transistors are used to drive the gate of a transistor programming switch that selectively interconnects desired circuit nodes.

When these prior-art flash-based FPGA devices are subjected to radiation, the charge stored on the floating gates of the flash transistors slowly leaks off, thus gradually degrading the drive signal provided to the transistor switch that is used to make the desired interconnection. The effect of radiation exposure on the floating gate flash transistors is cumulative. After a sufficient exposure to radiation, enough charge has leaked from the floating gates of the flash transistors so that the state of the switching transistor cannot be guaranteed.

BRIEF DESCRIPTION OF THE INVENTION

A radiation tolerant flash memory cell switch for FPGA and other applications according to the present invention includes a programming transistor switch coupled between two circuit nodes to be selectively connected to one another. A floating gate flash memory switch control circuit has a switch-control node coupled to the gate of the programming transistor switch. A sense transistor has a source coupled to the switch-control node, a gate coupled to a word line and a source coupled to a bit line. An addressing circuit is coupled to the word line and the bit line to periodically address the sense transistor. First and second sense amplifiers are coupled to the bit line. The first sense amplifier has a first current trip point higher than the current trip point of the second sense. Charge-leakage sensing logic is coupled to the first and second sense amplifiers and configured to generate a charge-leakage threshold signal when the sense transistor is addressed and the second sense amplifier has tripped but the first sense amplifier has not tripped. FPGA programming circuitry is coupled to the floating gate flash memory switch control circuit to reprogram the FPGA in response to the charge-leakage threshold signal.

In an illustrative embodiment contemplated herein, the floating gate flash memory switch control circuit includes a first floating gate flash transistor having a source coupled to a first potential, a drain, and a gate and a second floating gate flash transistor having a source connected to the drain of the first floating gate flash transistor to form the switch-control node, a gate coupled to the gate of the first floating gate flash transistor, and a drain coupled to a second potential. The switch node is coupled to the gate of the transistor programming switch.

A method according to the present invention for providing radiation tolerance to a flash-based FPGA integrated circuit employing a programming transistor switch coupled between two circuit nodes to be selectively connected to one another, the programming transistor switch having a gate and a floating gate flash memory switch control circuit having a switch-control node coupled to the gate of the programming transistor switch comprises periodically sensing a drive signal on the switch-control node during normal operation of the FPGA integrated circuit to determine if the drive signal is at a level below a refresh threshold. If the drive signal is at a level below the refresh threshold the FPGA integrated circuit is reprogrammed.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
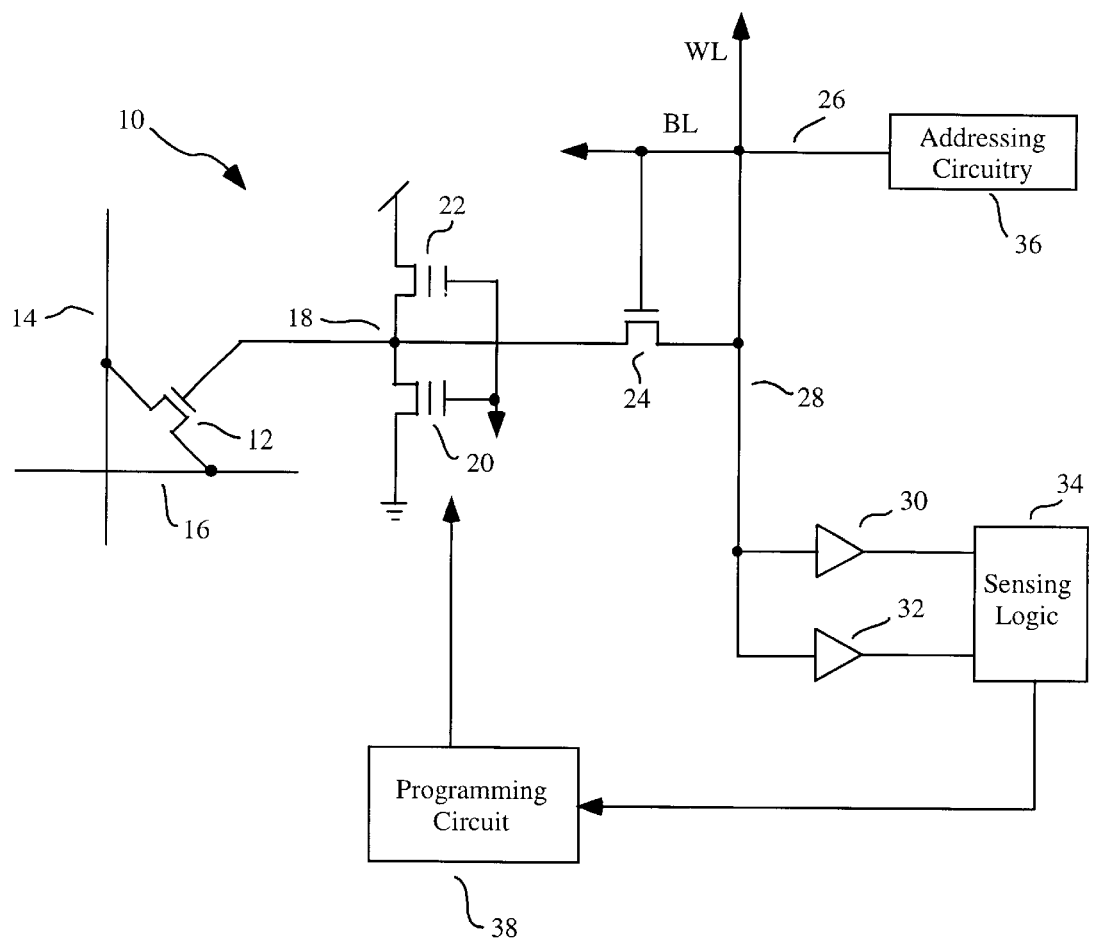
FIG. 1 is a block/schematic diagram of a portion of an exemplary flash-based FPGA integrated circuit employing an illustrative radiation tolerant flash memory cell switch according to the present invention.

Referring first to FIG. 1, a block/schematic diagram depicts a portion of an exemplary flash-based FPGA integrated circuit including an illustrative radiation tolerant flash memory cell switch 10 according to the present invention. Transistor programming switch 12 is shown coupled between interconnect conductors 14 and 16. When transistor programming switch 12 is turned on, interconnect conductor 14 is connected to interconnect conductor 16. Transistor programming switch 12 is shown in FIG. 1 as a simple MOS N-channel transistor and persons of ordinary skill in the art will appreciate that other switching devices can also be employed without departing from the spirit of the present invention.

Persons of ordinary skill in the art will also readily appreciate that numerous functions are performed in FPGA integrated circuits by switches such as transistor programming switch 12, including, but not limited to, circuit function definition, and circuit interconnect wiring. Therefore the example in FIG. 1 of the use of transistor programming switch 12 to selectively connect interconnect conductors 14 and 16 is merely illustrative for the purposes of explaining the present invention and should not be considered as in any way limiting the scope of the present invention.

The gate of transistor programming switch 12 is driven from a switch control node 18 of a floating gate flash memory switch control circuit. In FIG. 1, the floating gate flash memory switch control circuit is shown as a pair of floating gate flash memory transistors. A first floating gate flash memory transistor 20 has its source coupled to ground and its drain coupled to the switch control node 18. A second floating gate flash memory transistor 22 has its source coupled to the switch control node 18 and its drain coupled to Vcc.

The control gates of the first and second floating gate flash memory transistors are connected together and are seectively coupled to circuitry for supplying appropriate potentials for erasing, programming, and operating the floating gate flash memory switch control circuit as will be readily understood by persons of ordinary skill in the art. In addition, (and although not shown in FIG. 1) the Vcc and ground nodes of the flash transistor pair may be selectively coupled to voltages for transporting electrons onto and off of the floating gates for programming and erasing the flash transistors.

The operation of the thus-far described circuit is straightforward. If it is desired to make a circuit connection between interconnect conductors 14 and 16, transistor programming switch 12 must be turned on. The first floating gate flash memory transistor 20 is therefore turned off and the second floating gate flash memory transistor 22 is turned on. Under these conditions, switch control node 18 is pulled up to Vcc, thus turning on transistor programming switch 12. On the other hand, if it is desired to make no circuit connection between interconnect conductors 14 and 16, transistor programming switch 12 must be turned off. The first floating gate flash memory transistor 20 is therefore turned on and the second floating gate flash memory transistor 22 is turned off. Under these conditions, switch control node 18 is pulled down to ground, thus assuring that transistor programming switch 12 remains off.

As is well understood, as radiation impinges on the first and second floating gate flash memory transistors 20 and 22, the charge leaks off of their floating gates. After a sufficient amount of exposure to radiation, the voltage thresholds of first and second floating gate flash memory transistors 20 and 22 will be significantly shifted, as will the voltage at switch control node 18, to the point where the desired conduction state in the channel of transistor programming switch 12 cannot be guaranteed.

According to the present invention, the voltage at switch control node 18 is monitored or a current through the floating gate transistor is sensed to determine the value of the threshold voltage. When the voltage or current sensed falls below a predetermined threshold as will be disclosed herein, a reprogramming sequence for the FPGA integrated circuit is initiated to restore the voltage thresholds of first and second floating gate flash memory transistors 20 and 22 to their intended values.

To this end, sense transistor 24 has its gate coupled to bit line 26. The source of sense transistor 24 is coupled to switch control node 18 and its drain is coupled to word line 28. First and second sense amplifiers 30 and 32 are also coupled to word line 28. The outputs of first and second sense amplifiers 30 and 32 are coupled to charge-leakage sensing logic 34. As will be understood by persons of ordinary skill in the art, sense amplifiers 30 and 32 may comprise conventional sense amplifiers that are configured to sense the current flowing on word line 28 when sense transistor 24 is turned on. First sense amplifier 30 is set to a threshold level at which the drive signal to the gate of transistor programming switch 12 has not become degraded enough to adversely affect the operation of the FPGA integrated circuit that is being controlled. This threshold is higher than that higher than that to which second sense amplifier 32 has been set.

Using this scheme, if charge-leakage sensing logic 34 senses that the thresholds of both first and second sense amplifiers 30 and 32 have not been exceeded, it is an indication that the transistor programming switch has been programmed to be off. If charge-leakage sensing logic 34 senses that the thresholds of both first and second sense amplifiers 30 and 32 have been exceeded, it is an indication that the transistor programming switch has been programmed to be on and the drive level at the gate of transistor programming switch 12 is sufficient to assure proper operation of the FPGA circuit. If, however, charge-leakage sensing logic 34 senses that the threshold of only second sense amplifier 32 has been exceeded, it is an indication that the transistor programming switch has been programmed to be on but that the drive level at the gate of transistor programming switch 12 is insufficient to assure proper operation of the FPGA circuit.

In one mode of operation contemplated in accordance with the present invention, addressing circuitry 36 is used to periodically address sense transistor 24. When it is desired to address sense transistor 24, addressing circuitry 36 drives bit line 26 high, thus turning on sense transistor 24 and coupling switch control node 18 to the inputs of first and second sense amplifiers 30 and 32. If charge-leakage sensing logic 34 senses that the threshold of only second sense amplifier 32 has been exceeded, it generates a signal indicating that the FPGA should be refreshed (i.e., reprogrammed) to restore the floating gate charge to levels that assure proper threshold voltages in the flash transistors 20 and 22.

As illustrated in FIG. 1, this signal is coupled to programming circuit 38, which initiates a reprogramming cycle for first and second floating gate flash memory transistors 20 and 22, as well as all of the other floating gate flash memory transistors in the FPGA integrated circuit. The details of the connections between the programming circuit 38 and the first and second floating gate flash memory transistors 20 and 22 are not shown in FIG. 1. These details will differ depending on the geometry and structure of the individual flash memory transistors employed in the design, and configuration of the programming connections to first and second floating gate flash memory transistors 20 and 22 will be well known to persons of ordinary skill in the art once a particular flash cell is selected for use in an FPGA design.

Figure 2:
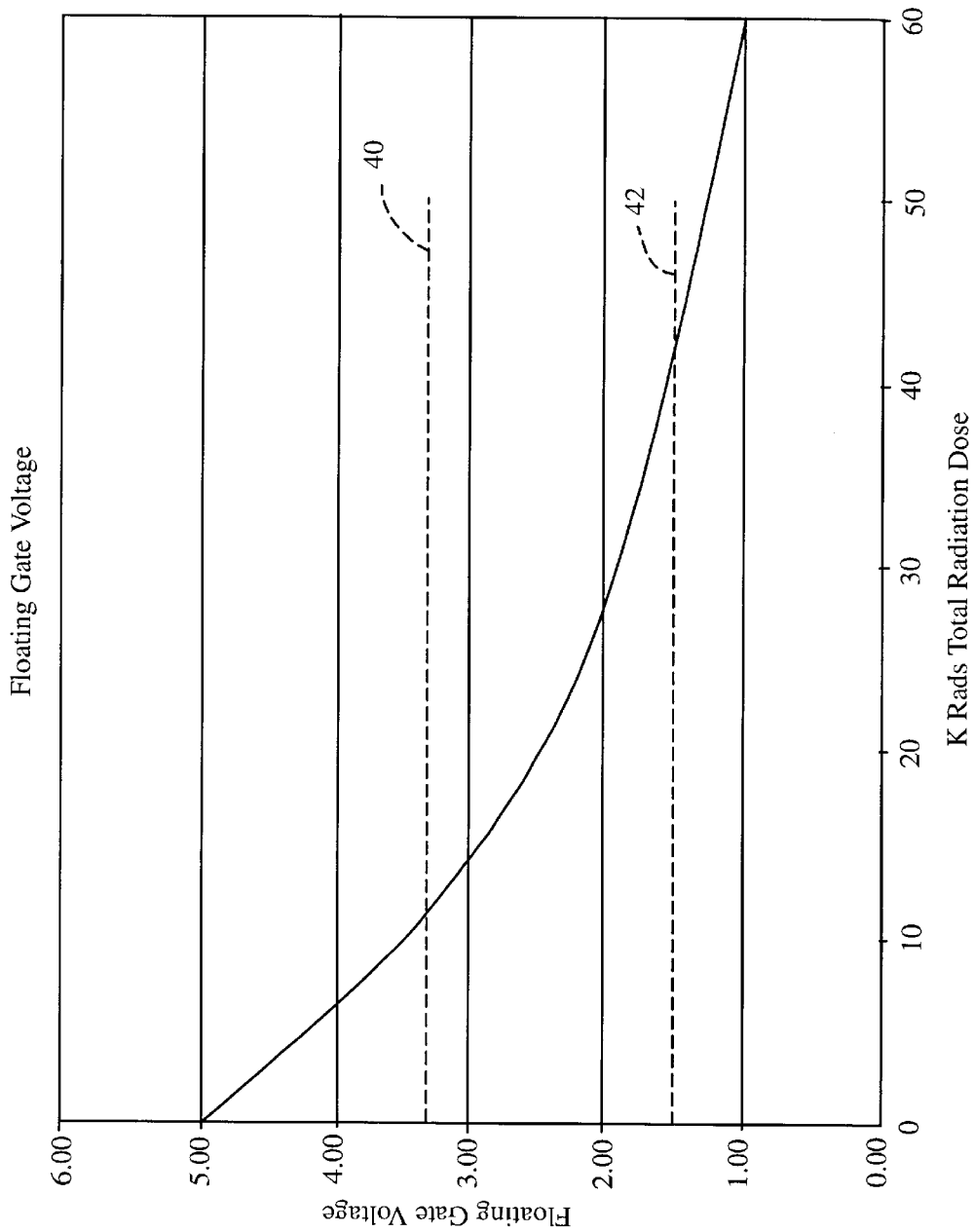
FIG. 2 is a graph illustrating the operation of the circuit of FIG. 1 as the charge on the floating gate of the flash memory cell degrades over time.

Referring now to FIG. 2, a graph illustrates the operation of the circuit of FIG. 1 as the charge on the floating gate of the flash memory cell degrades over time. The threshold of first sense amplifier 30 of FIG. 1 is depicted at dashed line 40 and the threshold of second sense amplifier 32 of FIG. 1 is depicted at dashed line 42. It can bee seen from an examination of FIG. 2 that the present invention will cause the flash cells that control the connectivity and circuit definition in the FPGA to be reprogrammed prior to the charge level on the floating gates degrading to a critical level.

Figure 3:
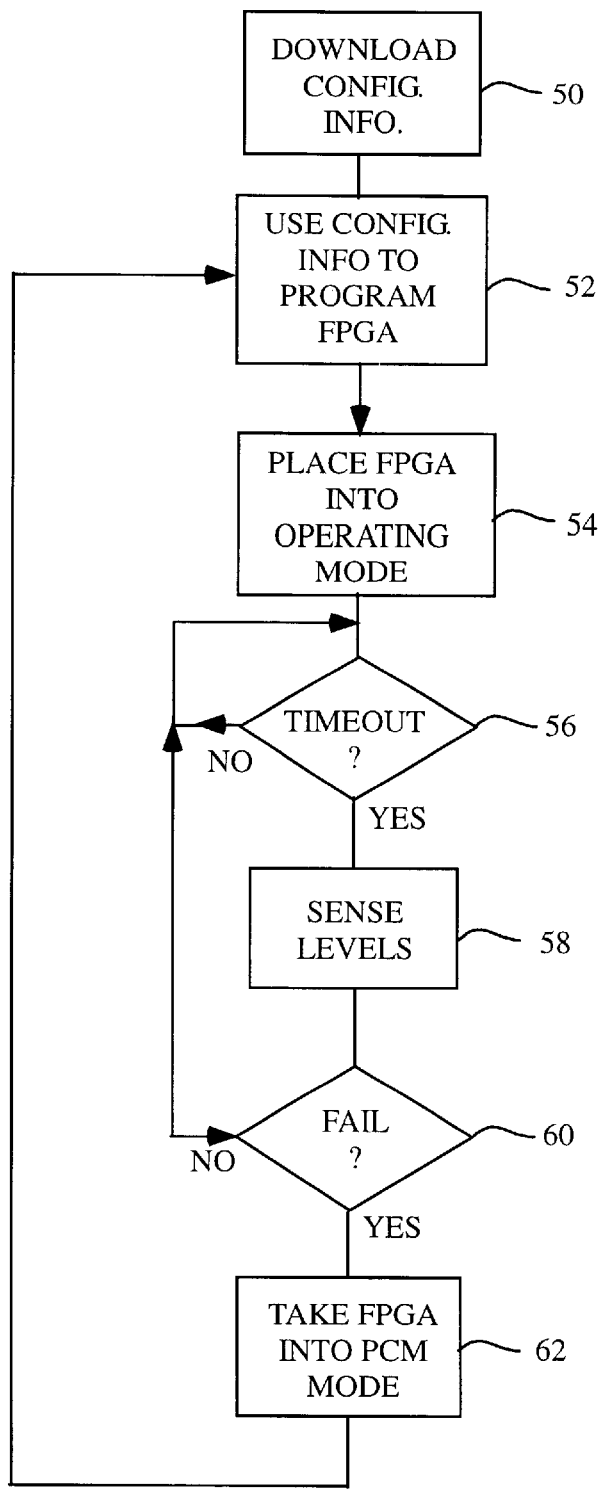
FIG. 3 is a flow diagram illustrating a method according to the present invention for providing radiation tolerance to a flash-based FPGA integrated circuit.

Referring now to FIG. 3, a flow diagram illustrates a method according to the present invention for providing radiation tolerance to a flash-based FPGA integrated circuit. FIG. 3 starts at block 50, where configuration information is downloaded into a programmer connected to the FPGA in order to initially program the FPGA. Next, at block 52, the configuration information is used to program the FPGA.

After being programmed, the FPGA is placed into operating mode at block 54 and begins to function as programmed. As the FPGA operates, it may become exposed to radiation that could potentially degrade its operation.

Decision diamond 56 is a timeout timer, and is set to time out at intervals at which the flash cell floating gates are to be examined. When timeout occurs, the levels of the floating gate charge as a function of the drive voltage on the gates of the transistor programming switches are sensed at block 58. In an actual FPGA incorporating the present invention, different schemes may be employed to determine if the FPGA has been exposed to radiation levels sufficient to warrant reprogramming. For example, according to one embodiment of the present invention, all of the floating gate charge levels may be sensed. In other embodiments of the invention, the charge levels of a selected sample number of floating gates may be sensed. A state machine, software, or other like hardware or software may be employed in a known manner to control addressing circuitry 36 to implement the selected level sensing scheme.

If none of the levels has been found to fail the threshold set by first sense amplifier 30 at decision diamond 60, the routine returns to decision diamond 56 to await another timeout interval. If, however, any of the sensed levels has failed the threshold set by first sense amplifier 30 at decision diamond 60, the FPGA is taken out of operating mode at block 62 and is reprogrammed at block 52 using the sensed level rather than the original configuration information, placed into operating mode again at block 54, and the cycle begins again.

As will be readily appreciated by persons of ordinary skill in the art, the arrangement shown in FIG. 1 including sense transistor 24, bit line 26, and word line 28 implements a familiar addressing scheme and may be used to interrogate the floating gate charge levels of an arbitrarily large number of floating gate flash memory switch control circuits in an integrated circuit. The sensing circuit associated with a particular word line can be used to sense the states of many floating gate flash memory switch control circuits associated with sense transistors coupled to that word line. Each word line may have its own sensing circuit, or a plurality of word lines may share the same sensing circuit using well-known addressing techniques.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In an FPGA, a radiation tolerant flash memory cell switch including:
    a programming transistor switch coupled between two circuit nodes to be selectively connected to one another, said programming transistor switch having a gate;
    a floating gate flash memory switch control circuit having a switch-control node coupled to the gate of said programming transistor switch;
    a sense transistor having a source coupled to said switch-control node, a gate coupled to a word line and a source coupled to a bit line;
    an addressing circuit coupled to said word line and said bit line to periodically address said sense transistor;
    a sensing circuit coupled to said bit line, said sensing circuit having a first current trip point and a second current trip point lower than said first current trip point;
    charge-leakage sensing logic coupled to said sensing circuit and configured to generate a charge-leakage threshold signal when said sense transistor is addressed and said second trip point has been reached but said first trip point has been reached; and
    FPGA programming circuitry coupled to said floating gate flash memory switch control circuit to reprogram said FPGA in response to said charge-leakage threshold signal.

2. The radiation tolerant flash memory cell switch of claim 1 wherein said floating gate flash memory switch control circuit includes a first floating gate flash transistor having a source coupled to a first potential, a drain, and a gate and a second floating gate flash transistor having a source connected to said drain of said first floating gate flash transistor to form said switch-control node, said switch node coupled to said gate of said transistor programming switch, a gate coupled to said gate of said first floating gate flash transistor, and a drain coupled to a second potential.

3. The radiation tolerant flash memory cell switch of claim 1 wherein:
    said sensing circuit comprises first and second sense amplifiers coupled to said bit line, said first sense amplifier having a first current trip point, said second sense amplifier having a second current trip point lower than said first current trip point; and
    said charge-leakage sensing logic coupled to said first and second sense amplifiers is configured to generate a charge-leakage threshold signal when said sense transistor is addressed and said second sense amplifier has tripped but said first sense amplifier has not tripped.

4. A method for providing radiation tolerance to a flash-based FPGA integrated circuit employing a programming transistor switch coupled between two circuit nodes to be selectively connected to one another, said programming transistor switch having a gate and a floating gate flash memory switch control circuit having a switch-control node coupled to the gate of the programming transistor switch comprising:
    periodically sensing a drive signal on said switch-control node during normal operation of said FPGA integrated circuit to determine if said drive signal is at a level below a refresh threshold; and
    reprogramming said FPGA integrated circuit if said drive signal is at a level below said refresh threshold.

\* \* \* \* \*